(12) United States Patent
Liu et al.

(10) Patent No.: US 8,399,330 B2
(45) Date of Patent: Mar. 19, 2013

(54) NANO-WIRE FIELD EFFECT TRANSISTOR, METHOD FOR MANUFACTURING THE TRANSISTOR, AND INTEGRATED CIRCUIT INCLUDING THE TRANSISTOR

(75) Inventors: Yongxun Liu, Tsukuba (JP); Takashi Matsukawa, Tsukuba (JP); Kazuhiko Endo, Tsukuba (JP); Shinichi Ouchi, Tsukuba (JP); Kunihiro Sakamoto, Tsukuba (JP); Meishoku Masahara, Tsukuba (JP)

(73) Assignee: National Institute of Advanced Industrial Science and Technology (JP)

( * ) Notice: Subject to any disclaimer, the term of this patent is extended or adjusted under 35 U.S.C. 154(b) by 0 days.

(21) Appl. No.: 13/477,239

(22) Filed: May 22, 2012

(65) Prior Publication Data

US 2012/0238082 A1    Sep. 20, 2012

Related U.S. Application Data

(62) Division of application No. 12/991,226, filed as application No. PCT/JP2009/060310 on Jun. 5, 2009, now abandoned.

(30) Foreign Application Priority Data

Jun. 9, 2008    (JP) ................................. 2008-150439

(51) Int. Cl.
    *H01L 21/331*    (2006.01)
(52) U.S. Cl. .................. 438/311; 438/479; 257/E51.04
(58) Field of Classification Search .................. 438/311, 438/479; 257/E51.04
    See application file for complete search history.

(56) References Cited

U.S. PATENT DOCUMENTS

| | | | |
|---|---|---|---|
| 5,405,454 A * | 4/1995 | Hirai et al. .................. 148/33.2 |
| 6,630,388 B2 | 10/2003 | Sekigawa et al. | |
| 7,274,051 B2 * | 9/2007 | Kim et al. ....................... 257/213 |
| 7,297,568 B2 * | 11/2007 | Kawakatsu et al. ............. 438/52 |
| 7,491,995 B2 * | 2/2009 | Forbes .......................... 257/296 |
| 7,642,578 B2 * | 1/2010 | Lee et al. ....................... 257/288 |
| 7,892,956 B2 * | 2/2011 | Deligianni et al. ........... 438/585 |
| 7,893,492 B2 * | 2/2011 | Bedell et al. ................... 257/346 |
| 8,106,382 B2 * | 1/2012 | Saitoh et al. ..................... 257/24 |
| 8,110,471 B2 * | 2/2012 | Lee et al. ........................ 438/308 |
| 2006/0128088 A1 * | 6/2006 | Graham et al. ............... 438/202 |
| 2007/0029623 A1 * | 2/2007 | Liu et al. ....................... 257/401 |
| 2007/0105321 A1 * | 5/2007 | Lee et al. ...................... 438/270 |
| 2009/0066348 A1 * | 3/2009 | Shin et al. ...................... 324/693 |

FOREIGN PATENT DOCUMENTS

JP            06188432 A        8/1994

OTHER PUBLICATIONS

Sung Dae Suk et al, High-performance 5nm radius Twin Silicon Nanowire MOSFET (TSNWFET): Fabrication on Bulk Si Wafer, Characteristics, and Reliability; 2005, IEEE.
Fu-Liang Yang et al, 5nm-Gate Nanowire FinFET; 2004 Symposium on VSLI Technology Digest of Technical Papers; pp. 196-197.
Digh Hisamoto et al, FinFET—A Self-Aligned Double-Gate MOSFET Scalable to 20 nm; IEEE Transactions on Electron Devices, vol. 47, No. 12, Dec. 2000; pp. 2320-2325.

* cited by examiner

*Primary Examiner* — Marcos D. Pizarro
*Assistant Examiner* — Bilkis Jahan
(74) *Attorney, Agent, or Firm* — Bacon & Thomas, PLLC (57) ABSTRACT

A manufacturing method of the nano-wire field effect transistor, comprising steps of preparing an SOI substrate having a (100) surface orientation; processing a silicon crystal layer comprising the SOI substrate into a standing plate-shaped member having a rectangular cross-section; processing the silicon crystal layer by orientation dependent wet etching and thermal oxidation into a shape where two triangular columnar members are arranged one above the other with a spacing from each other so as to face along the ridge lines of the triangular columnar members; and processing the two triangular columnar members into a circular columnar member configuring a nano-wire by hydrogen annealing or thermal oxidation.

2 Claims, 12 Drawing Sheets

Plan View

FIG. 2

A-A' Cross-sectional View

FIG. 3

B-B' Cross-sectional View

Plan View

FIG. 21

A-A' Cross-sectional View

FIG. 22

B-B' Cross-sectional View

FIG. 23

Plan View

FIG. 24

A1-A1' Cross-Sectional View    A2-A2' Cross-sectional View

FIG. 25

B-B' Cross-sectional View

FIG. 26

Plan View

FIG. 27

A1-A1' Cross-sectional View     A2-A2' Cross-sectional View

FIG. 28

B-B' Cross-sectional View

FIG. 29

Plan View

FIG. 30

A-A' Cross-sectional View

FIG. 31

B-B' Cross-sectional View

FIG. 32

Plan View

FIG. 33

A-A' Cross-sectional View

FIG. 34

B-B' Cross-sectional View

NANO-WIRE FIELD EFFECT TRANSISTOR, METHOD FOR MANUFACTURING THE TRANSISTOR, AND INTEGRATED CIRCUIT INCLUDING THE TRANSISTOR

CROSS REFERENCE

This application is a divisional application of pending U.S. patent application Ser. No. 12/991,226, filed on Nov. 5, 2010, 2007, which is the U.S. national phase of International Patent Application No. PCT/JP2009/060310, filed on Jun. 5, 2009, which claims priority to Japanese Application No. 2008-150439, filed on Jun. 9, 2008, the entire disclosures of which are incorporated herein by reference.

TECHNICAL FIELD

The present invention relates a nano-wire field effect transistor, a method for manufacturing the transistor, and an integrated circuit including the transistor.

BACKGROUND ART

Silicon integrated circuits have been progressed in enlarging the scale as well as in improving the performance according to so-called Moore's rule, and supported the development of the advanced information technology (IT) society from an aspect of the hardware. This trend is expected to be continued also in future. However, it is deeply concerned that miniaturization of the conventional bulk type CMOS integrated circuit will reach its limit in near future. Its main reasons are an increase in leakage current due to the miniaturization of the transistor, a degradation in switching property of the transistor (an increase in the sub-threshold slope) and so on. In other word, a serious problem lies in that the more the technology node progresses, the more percentage of inefficient power consumption due to the leakage current rather than the operating power increases.

In order to overcome this essential difficulty, the ITRS road map has declared an introduction of an ultra-thin body, fully depleted SOI (Silicon-On-Insulator) device, double-gate/multi-gate MOSFET and so on in an early stage of the decade from 2010 year. Especially, a global attention has been directed towards a fin type double gate MOSFET (FinFET) having a standing, lateral channel (Refer to Non Patent Document 1) as a promising candidate device after the 32 nm node. Even with this double gate MOSFET, however, it is still not easy to perfectly suppress increase of the leakage current and the sub-threshold slope due to the short channel effect when the gate length of the device is decreased to 20 nm or below (corresponding to a stage after the 32 nm node). Furthermore, the dimension of the channel is required to be small corresponding to shortening the gate length, but forming the small channel is difficult.

Since the threshold voltage of the FinFET described above is a fixed value, it is not available for applications such as dynamic electric power control. Proposal to overcome such a drawback has already been made. For example, Patent Document 1 and 2 realizes threshold voltage control by physically separating and electrically isolating the gate electrodes which sandwich a vertical type channel, by applying a fix bias voltage to one of the gate electrodes, and by driving the transistor with the other gate electrode. By changing the fixed bias voltage value, the drain current versus gate voltage characteristics ($I_d$-$V_g$) of the transistor shifts horizontally, thereby enabling the threshold voltage control.

When the threshold voltage is controlled by a gate voltage on one side, however, the sub-threshold slope inevitably increases significantly from the ideal value S=60 mV/decade, which leads to a degradation of the switching characteristics of the device. Further problem is that the drain current decreases significantly when the threshold voltage is controlled by applying a voltage to one of the gate electrodes, since the gate bias works to a direction for one of the channels to close.

Figure 29:
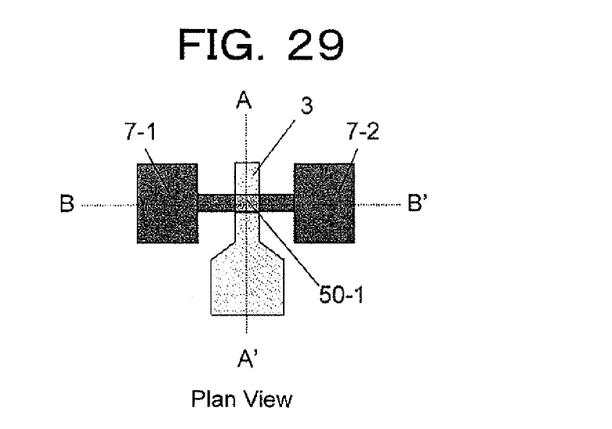
FIG. 29 is a plan view of the conventional nano-wire field effect transistor.
Figure 30:
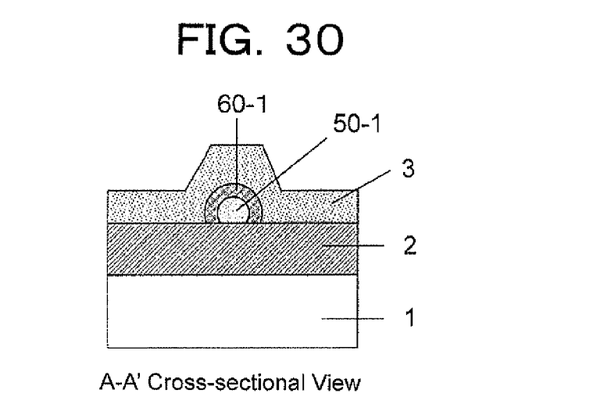
FIG. 30 is an A-A' cross-sectional view of FIG. 29.
Figure 31:
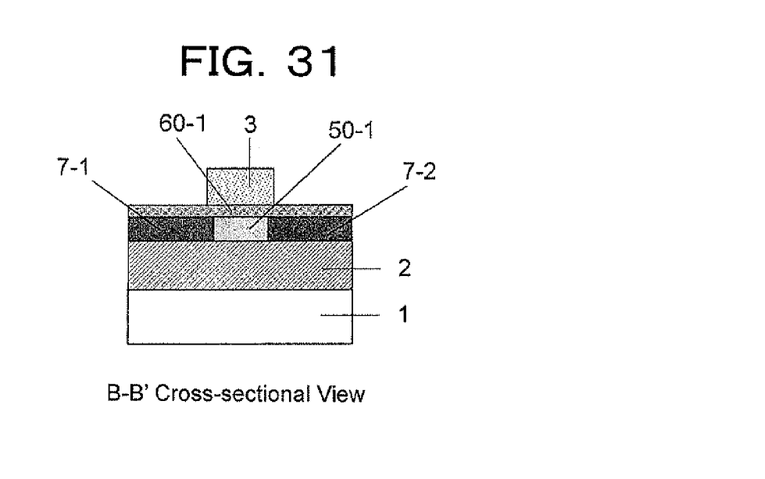
FIG. 31 is a B-B' cross-sectional view of FIG. 29.

In recent years, a silicon nano-wire field effect transistor has been actively studied and developed as a device structure to break through the limit of the channel miniaturization in order to overcome the problems such as the short channel effect, decrease in the driving current, difficulty in formation of a fine channel and so on described above for the FinFET. A silicon nano-wire field effect transistor such as shown, for example, in FIGS. 29, 30 and 31 has been proposed (Non Patent Document 2 and 3). Features of such a device structure include the channel having a nano-meter sized circular cross-section shape, and a gate electrode covering around the channel. This structure has, therefore, a stronger controllability to a channel potential by the gate and is more effective in suppressing the short channel effect compared with the FinFET. This structure also gives some latitude in channel miniaturization. In other words, the dimension of the channel can favorably be larger than the gate length. This is resulted from that the gate electrode tightly covers all around the channel (Gate-All-Around: GAA) in the nano-wire field effect transistor, whereas the gate electrode covers only two sides of the channel in FinFET.

Figure 32:
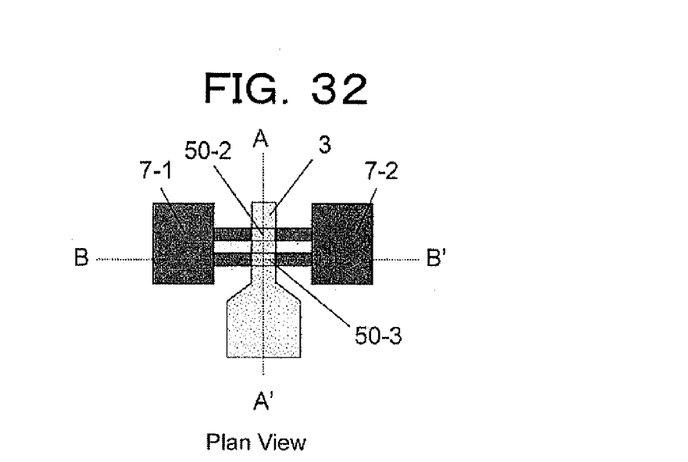
FIG. 32 is a plan view of the conventional nano-wire field effect transistor with a lateral arrangement of two nano-wires.
Figure 33:
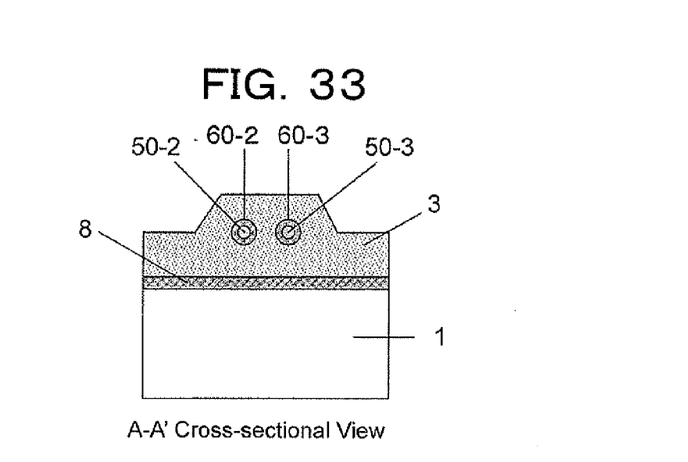
FIG. 33 is an A-A' cross-sectional view of FIG. 32.
Figure 34:
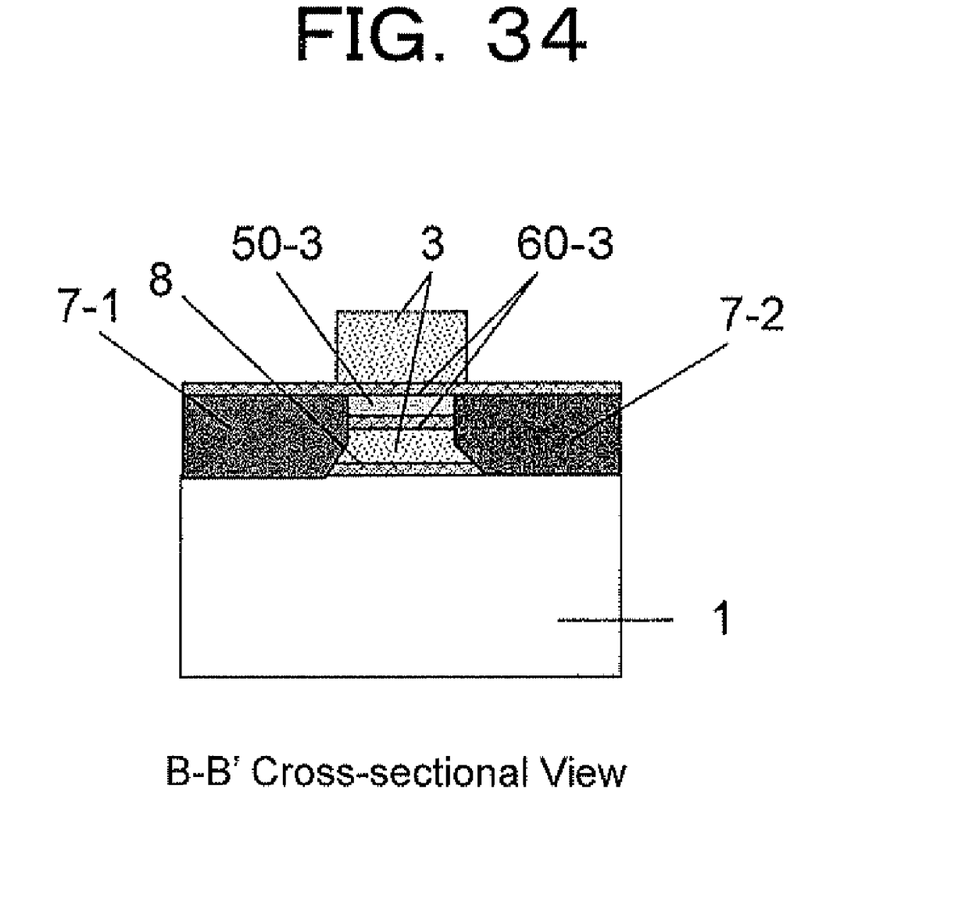
FIG. 34 is a B-B' cross-sectional view of FIG. 32.

In order to increase the driving current, a plurality of nano-wires each having a circular cross-section shape are arranged laterally in the nano-wire field effect transistor proposed so far, as shown, for example, in FIGS. 32, 33 and 34. This structure, however, would enlarge the device area.

Patent Document 1: Japanese Patent Application Publication No. 2002-270850.
Patent Document 2: Japanese Patent Application Publication No. 2005-167163.
Non Patent Document 1: IEEE Trans. Electron Devices, Vol. 47. No. 12, pp. 2320-2325, 2000.
Non Patent Document 2: Symposium on VLSI Technology 2004, pp. 196-197.
Non Patent Document 3: Sung Dae Suk, et al., IEDM Tech. Dig., pp. 735-738, 2005.

DISCLOSURE OF INVENTION

Problems to be Solved by the Invention

The object of the present invention is to solve the above problems of the conventional nano-wire field effect transistor and to increase the driving current without increasing device area.

Solutions to Solve the Subject

The above problems can be solved by following means.
(1) A nano-wire field effect transistor, characterized in that an even number of columnar members configuring nano-wires and being made from silicon crystal are arranged over a substrate in parallel and in the vertical direction to a surface of the substrate.
(2) The nano-wire field effect transistor in accordance with the above description (1), characterized in that a plurality set of the even number of columnar members are arranged in parallel.

(3) The nano-wire field effect transistor in accordance with the above description (1) or (2), characterized in that the silicon crystal is a SOI (Silicon-On-Insulator) layer configuring an SOI substrate.

(4) The nano-wire field effect transistor in accordance with the above description (3), characterized in that the SOI substrate has a (100) surface orientation, and that the columnar member is a circular columnar member (also referred to as "a nano-wire having a circular cross-section shape" in this description).

(5) The nano-wire field effect transistor in accordance with the above description (4), characterized in that around the circular columnar member a gate electrode is provided via a gate insulator film.

(6) An integrated circuit including the nano-wire field effect transistor in accordance with the above description any of (1) to (5).

(7) The integrated circuit in accordance with the above description (6), further including the nano-wire field effect transistor which lacks an upper columnar member in an even number of columnar members configuring nano-wires.

(8) A manufacturing method of the nano-wire field effect transistor, comprising steps of:
preparing an SOI substrate having a (100) surface orientation;
processing a silicon crystal layer comprising the SOI substrate into a standing plate-shaped member having a rectangular cross-section;
processing the silicon crystal layer by orientation dependent wet etching and thermal oxidation into a shape where two triangular columnar members are arranged one above the other with a spacing from each other so as to face along the ridge lines of the triangular columnar members; and
processing the two triangular columnar members into circular columnar members configuring a nano-wire by hydrogen annealing or thermal oxidation.

(9) A manufacturing method of the nano-wire field effect transistor, comprising steps of:
preparing an SOI substrate having a (100) surface orientation and including two or more of SOI layers and buried oxide films;
processing a silicon crystal layer configuring the SOI substrate into a standing plate-shaped member having a rectangular cross-section;
processing the silicon crystal layer by orientation dependent wet etching and thermal oxidation into a shape where two triangular columnar members are arranged one above the other with a spacing from each other so as to face along the ridge lines of the triangular columnar members; and
processing the two triangular columnar members into circular columnar members configuring a nano-wire by hydrogen annealing or thermal oxidation.

Furthermore, the "nano-wire field effect transistor" of the above description (1) to (3) includes not only a nano-wire field effect transistor configuring a nano-wire having a circular cross-section shape but also a nano-wire field effect transistor configuring a nano-wire having a polygonal cross-section shape.

Effectiveness of the Invention

In accordance with the present invention, there are provided two nano-wires arranged one above the other on an SOI substrate having a (100) surface orientation. Therefore, the driving current of the transistor becomes twice as large as that of the conventional nano-wire field effect transistor with the same device area.

In addition, by fabricating the nano-wire with orientation dependent wet etching, the channel has a smooth surface with an atomic layer order which is superior in size reproducibility and uniformity.

Therefore, the present invention can improve a variation in size and characteristics in the conventional nano-wire having a circular cross-section shape formed by high temperature hydrogen annealing or thermal oxidizing from a nonuniform silicon thin wire prepared by RIE (Reactive Ion Etching).

BEST MODE FOR CARRYING OUT THE INVENTION

Detailed descriptions will be given below by demonstrating some embodiments of the field effect transistors in accordance with the present invention.

For convenience, a device fabricated by the gate-last-process; using a not-intentionally doped (non-doped) SOI (Silicon-On-Insulator) substrate having a (100) surface orientation, and forming two vertically symmetrical nano-wires each having a circular cross-section shape are formed simultaneously by reactive ion etching (RIE), orientation dependent wet etching and thermal oxidation, and high temperature hydrogen annealing or thermal oxidation is described. However, a similar device can be fabricated by the gate-first-process. In the gate-first-process, an impurity ion is introduced to the source-drain regions by ion implantation after fabricating the gate pattern.

First Embodiment

Figure 1:
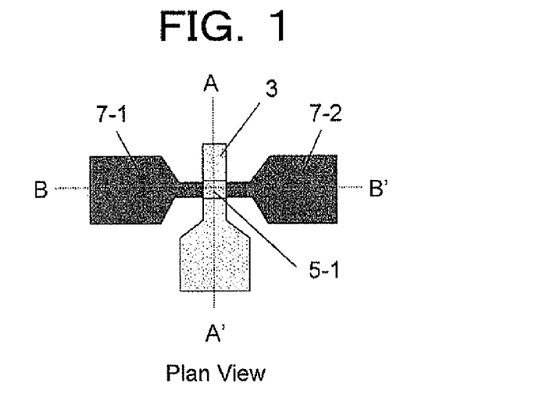
FIG. 1 is a plan view of a nano-wire field effect transistor in accordance with the first embodiment of the present invention.
Figure 2:
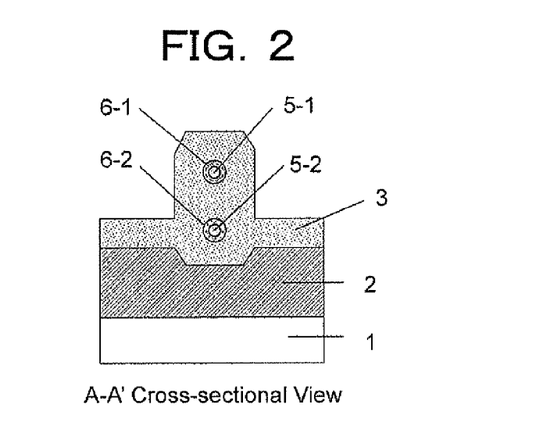
FIG. 2 is an A-A' cross-sectional view of FIG. 1. (2.)
Figure 3:
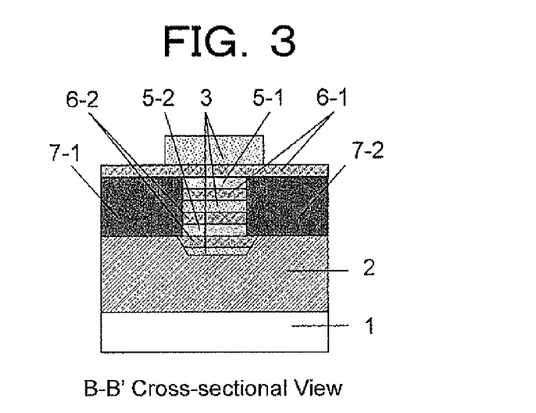
FIG. 3 is a B-B' cross-sectional view of FIG. 1.

FIGS. 1, 2 and 3 show a first embodiment in accordance with the present invention. FIG. 1 is a plan view of a nano-wire field effect transistor in accordance with the present invention, the transistor having a pair of nano-wires each having a circular cross-section shape and being arranged one above the other formed on a (100) SOI substrate. FIG. 2 is an A-A' cross-sectional view thereof, and FIG. 3 is a B-B' cross-sectional view thereof. In FIGS. 1 to 3, numeral reference 1 denotes a substrate, 2 denotes a buried oxide film, 3 denotes a gate electrode, 5-1 and 5-2 denote nano-wires each having a circular cross-section shape and simultaneously formed one above the other. 6-1 and 6-2 are gate insulator films, and 7-1 and 7-2 are a source region and a drain region, respectively.

FIGS. 4 to 19 show an example of a fabrication process of the nano-wire field effect transistor having a pair of nano-wires each having a circular cross-section shape and being arranged one above the other in accordance with the first embodiment of the present invention. In FIGS. 4 to 19, Figs. (A) shows an A-A' cross-sectional view, and Figs. (B) shows a B-B' cross-sectional view.

Figure 4:
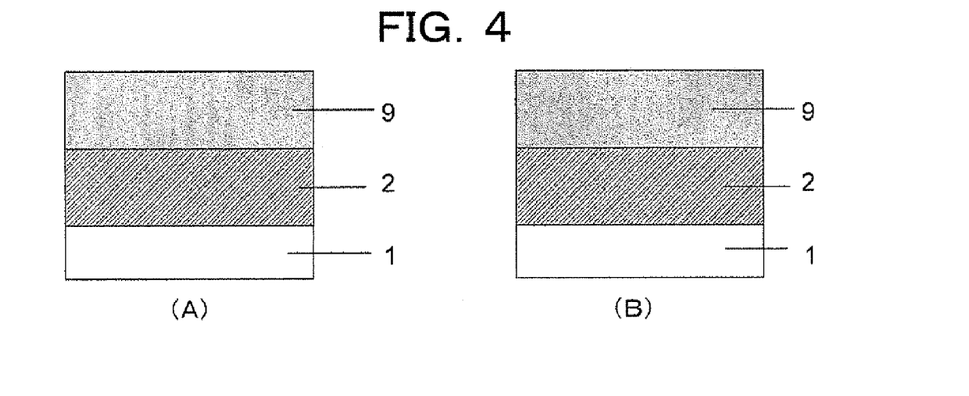
FIG. 4 is a fabrication process diagram of the nano-wire field effect transistor in accordance with the first embodiment of the present invention.

First, as shown in FIG. 4, an SOI wafer with a buried oxide film 2 and a silicon crystal layer 9 having a (100) surface orientation is prepared on a silicon substrate 1.

Figure 5:
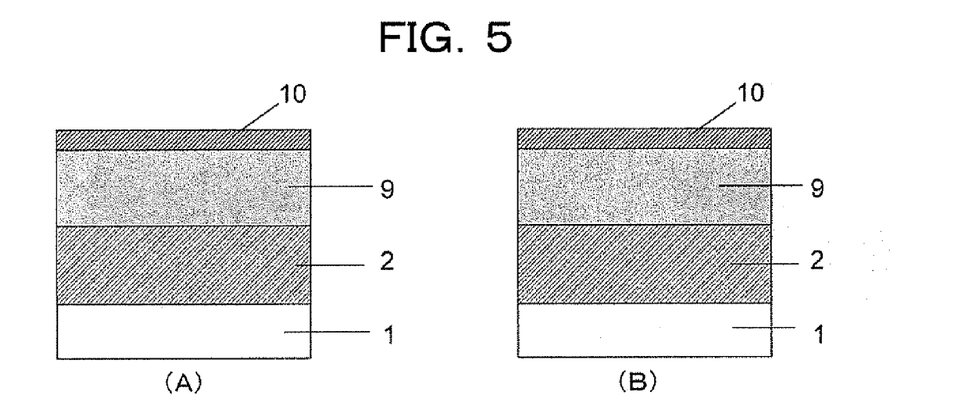
FIG. 5 is a fabrication process diagram of the nano-wire field effect transistor in accordance with the first embodiment of the present invention.

Next, an oxide film 10 is formed by utilizing thermal oxidation, as shown in FIG. 5.

Figure 6:
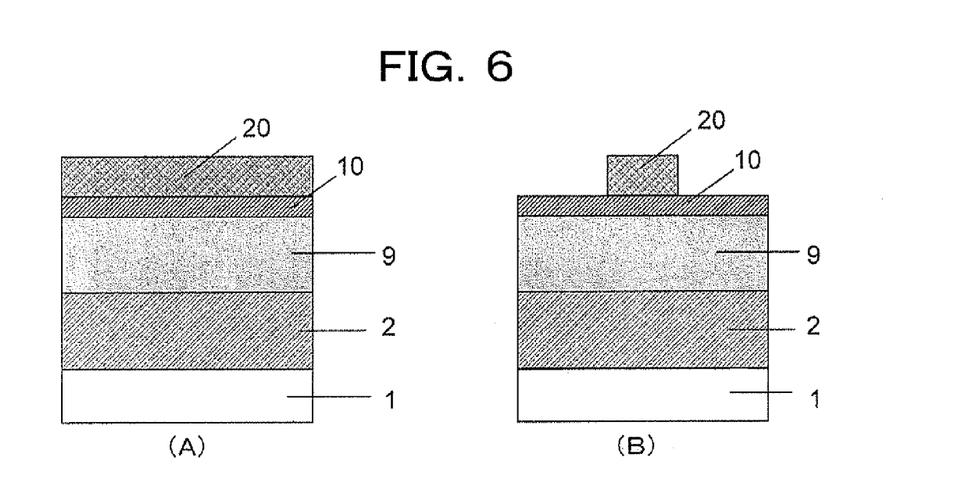
FIG. 6 is a fabrication process diagram of the nano-wire field effect transistor in accordance with the first embodiment of the present invention.
Figure 7:
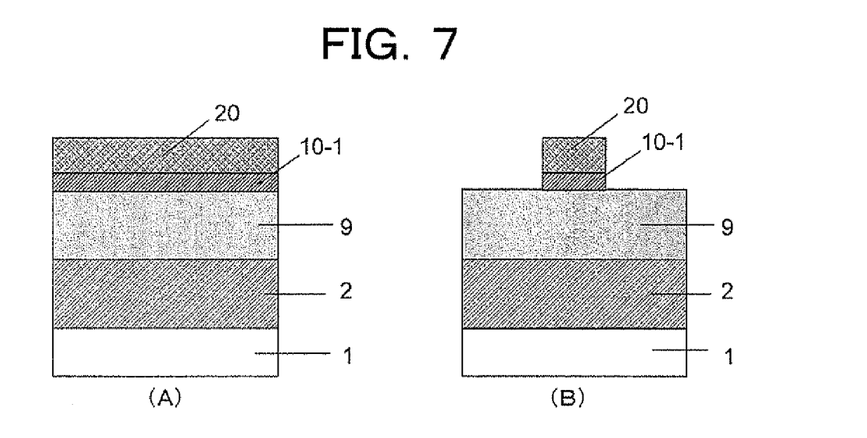
FIG. 7 is a fabrication process diagram of the nano-wire field effect transistor in accordance with the first embodiment of the present invention.

In the next step, a resist pattern 20 is formed by electron beam lithography, as shown in FIG. 6. In the following step, a resist pattern 20 is transferred into the oxide film 10 to form a hard mask 10-1 by RIE, as shown in FIG. 7.

Figure 8:
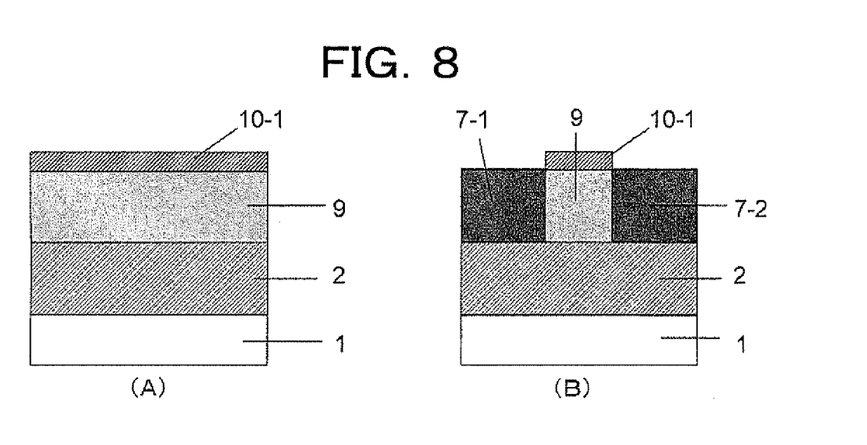
FIG. 8 is a fabrication process diagram of the nano-wire field effect transistor in accordance with the first embodiment of the present invention.

In the next step, after a source region 7-1 and a drain region 7-2 are formed as shown in FIG. 8 by ion implantation using the resist pattern 20 and the hard mask 10-1 as protection films. The resist pattern is removed by oxygen plasma and an aqueous solution of such as sulfuric acid and hydrogen peroxide, and the oxide film hard mask 10-1 is removed by hydrofluoric acid. Such ion implantation process is performed twice, each for forming source-drain regions of a PMOS and an source-drain regions of NMOS, respectively. In the ion implantation process, P or As is used as an ion species for an NMOS transistor, and B or $BF_2+$ is used as an ion species for a PMOS transistor.

Figure 9:
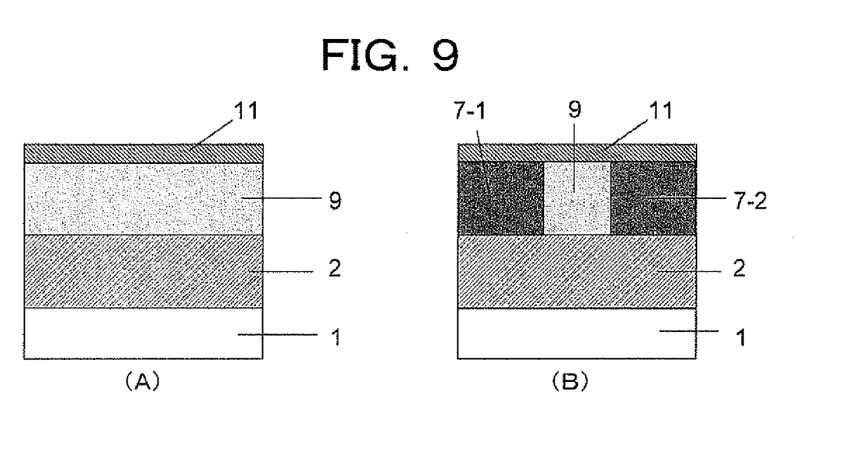
FIG. 9 is a fabrication process diagram of the nano-wire field effect transistor in accordance with the first embodiment of the present invention.
Figure 10:
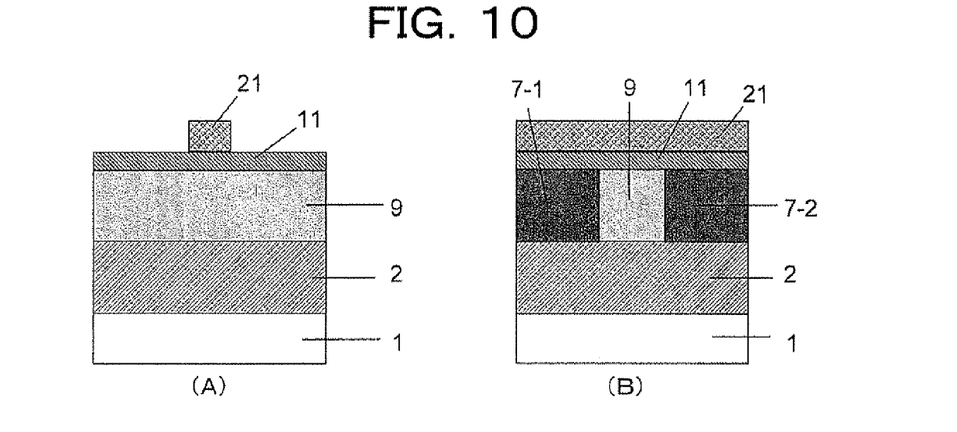
FIG. 10 is a fabrication process diagram of the nano-wire field effect transistor in accordance with the first embodiment of the present invention.
Figure 11:
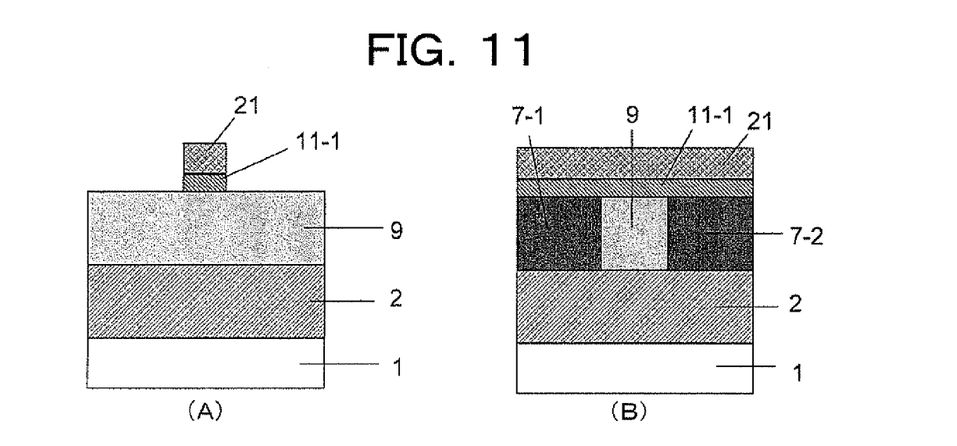
FIG. 11 is a fabrication process diagram of the nano-wire field effect transistor in accordance with the first embodiment of the present invention.
Figure 12:
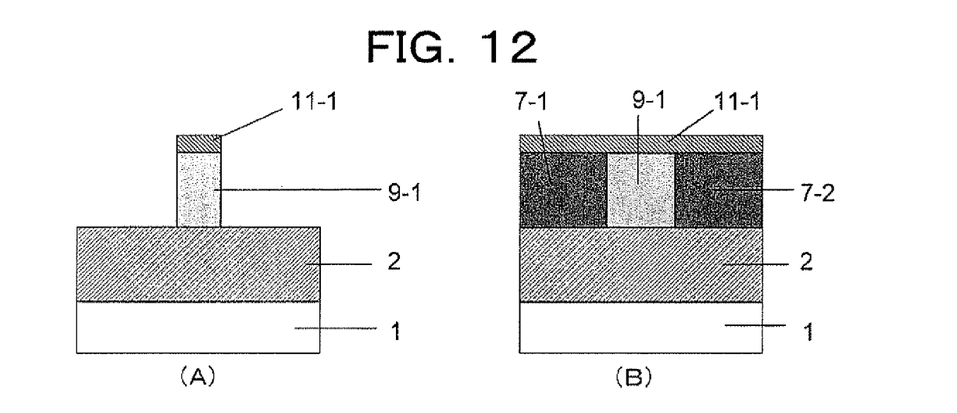
FIG. 12 is a fabrication process diagram of the nano-wire field effect transistor in accordance with the first embodiment of the present invention.

In the next step, a new oxide film 11 is deposited by CVD (Chemical Vapor Deposition), as shown in FIG. 9. It is preferable to perform annealing at a temperature T=850° C. in a nitrogen ambient for 2 minutes, since the etching rate of the CVD oxide film in a diluted hydrofluoric acid solution is too high. In the following step, a nanometer-sized resist pattern 21 is formed by electron beam lithography, as shown in FIG. 10. In the next step, the resist pattern 21 is transferred to the CVD oxide film 11 by RIE to form a hard mask 11-1, as shown in FIG. 11. The resist pattern 21 is then removed by using an oxygen plasma process and an aqueous solution including sulfuric acid and hydrogen peroxide and the like. In the following step, the (100) SOI layer 9 is vertically etched with a RIE process by using the hard mask 11-1 to form a silicon nano-wire 9-1 with a rectangular cross-section, as shown in FIG. 12. Then reaction product of RIE is removed by oxygen plasma, and cleaning is performed by aqueous solution of such as sulfuric acid and hydrogen peroxide.

Figure 13:
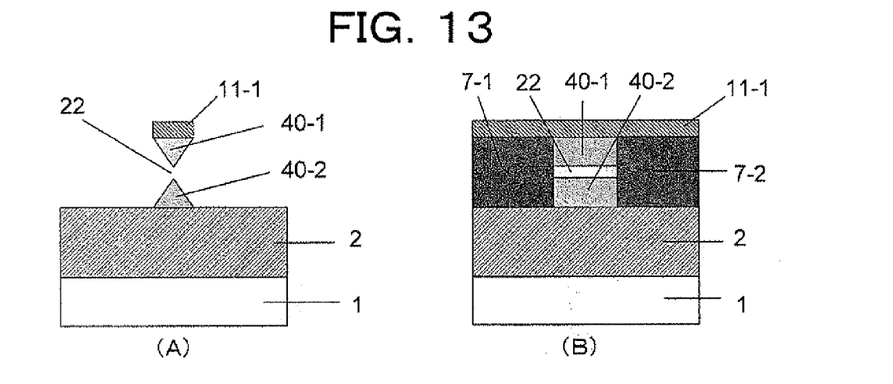
FIG. 13 is a fabrication process diagram of the nano-wire field effect transistor in accordance with the first embodiment of the present invention.

In the following step, as shown in FIG. 13, the width of the hard mask 11-1 is finely adjusted by using a diluted hydrofluoric acid solution. A vertically symmetric pair of nano-wires each having a triangular cross-section 40-1 and 40-2 are formed by performing an orientation dependent wet etching of the rectangular silicon channel 9-1 from the side surfaces by using an alkaline aqueous solution such as TMAH (Tetramethylammonium Hydroxide) after the fine adjustment step. The nano-wires each having a triangular cross-section are formed approximately with self alignment, since the surface orientation of both of the side surfaces of the nano-wires each having a triangular cross-section becomes (111) plane and the etching rate of this plane by TMAH ¼₀ smaller than that of a (110) plane. The etching time needs to be controlled precisely to prevent the nano-wire with a triangular cross-section from being over-etched. Whether a gap 22 is formed between the upper and the lower nano-wires each having a triangular cross-section or not depends on the width W of the hard mask 11-1 and the thickness H of the SOI. More specifically, in a case where W<H/tan 55° a gap 22 is formed, but not in a case where W>H/tan 55°. The former condition is adopted here. However, the latter condition is selected in a case where a separation between the upper and the lower nano-wires each having a triangular cross-section is performed in a thermal oxidation process in a later step.

Figure 14:
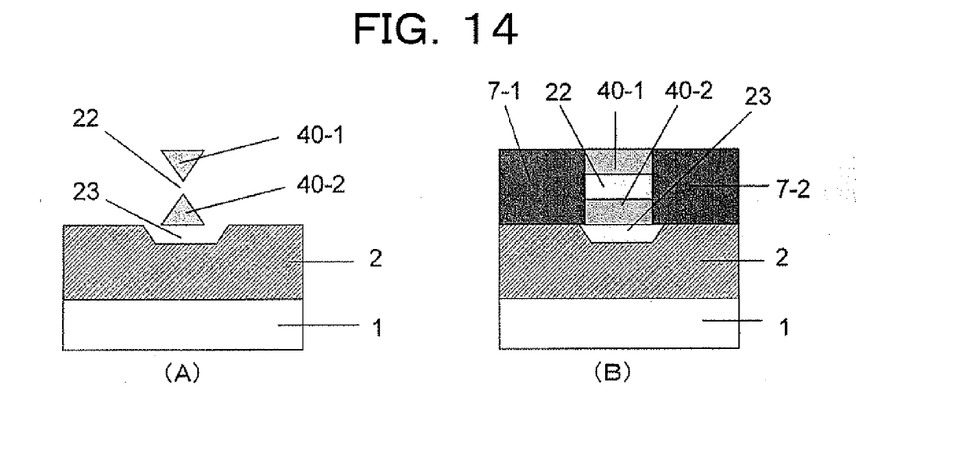
FIG. 14 is a fabrication process diagram of the nano-wire field effect transistor in accordance with the first embodiment of the present invention.

In the following step, as shown in FIG. 14, the hard mask 11-1 and the buried oxide film 2 under the nano-wire with a triangular cross-section 40-2 are etched by using a hydrofluoric acid solution, then a gap 23 is formed.

Figure 15:
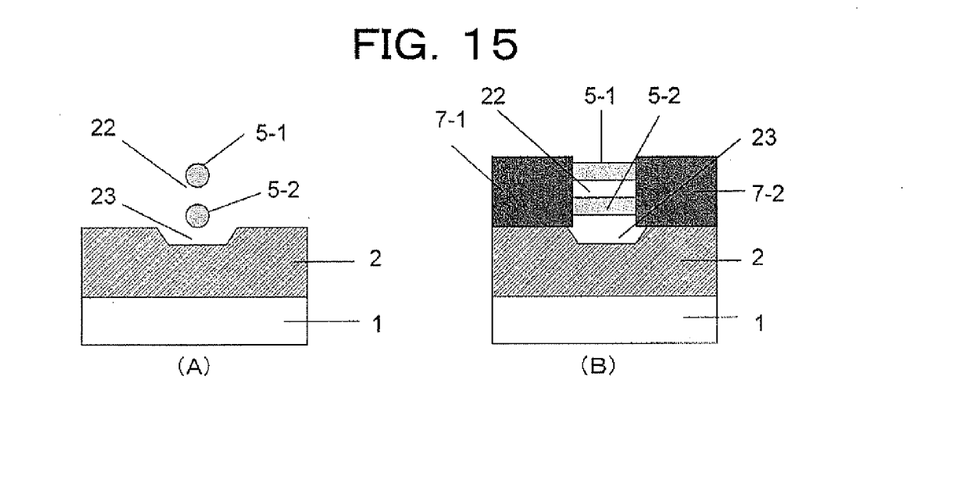
FIG. 15 is a fabrication process diagram of the nano-wire field effect transistor in accordance with the first embodiment of the present invention.
Figure 16:
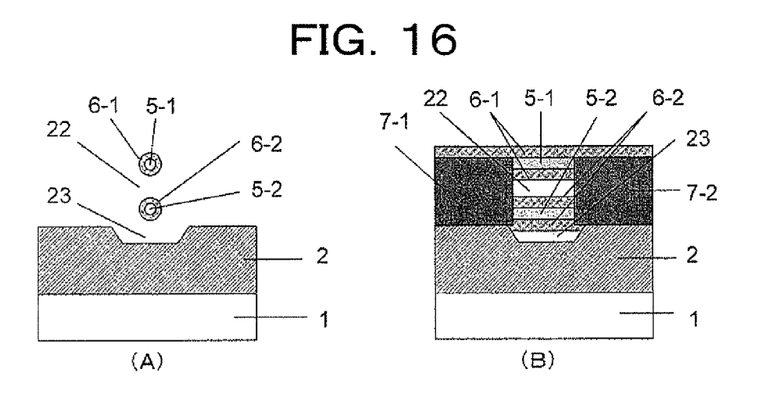
FIG. 16 is a fabrication process diagram of the nano-wire field effect transistor in accordance with the first embodiment of the present invention.

In the following step, as shown in FIG. 15, a high temperature hydrogen annealing process is performed to deform the nano-wires each having a triangular cross-section 40-1 and 40-2 to nano-wires each having a circular cross-section shape 5-1 and 5-2. In the next step, gate oxide films 6-1 and 6-2 are formed by utilizing thermal oxidation, as shown in FIG. 16. In this process, in place of the oxide film a high permittivity (high-k) material deposited by the CVD method may also be used as a gate insulator film.

Figure 17:
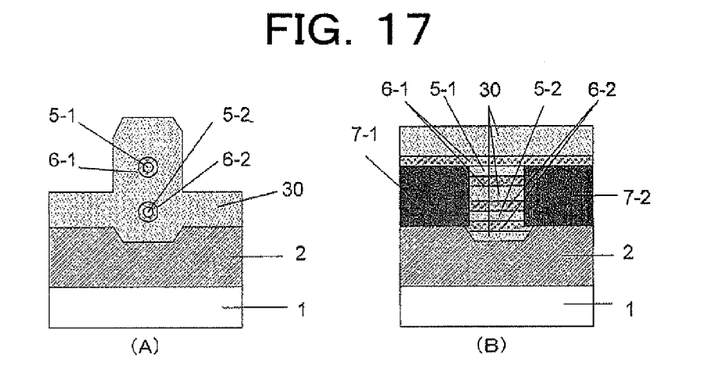
FIG. 17 is a fabrication process diagram of the nano-wire field effect transistor in accordance with the first embodiment of the present invention.
Figure 18:
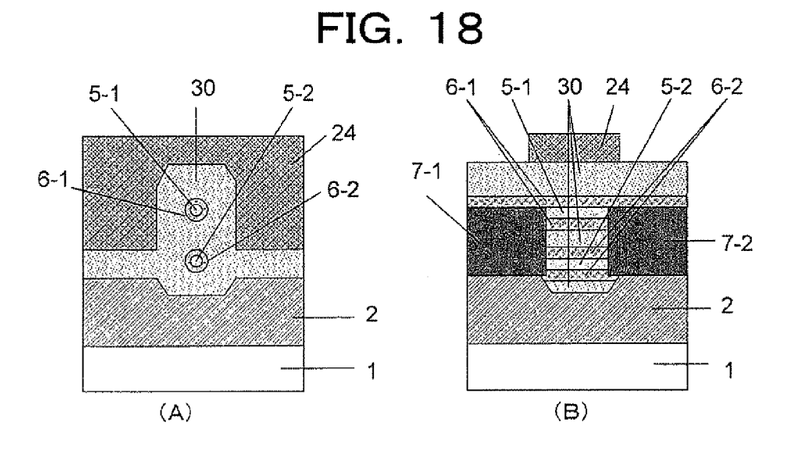
FIG. 18 is a fabrication process diagram of the nano-wire field effect transistor in accordance with the first embodiment of the present invention.
Figure 19:
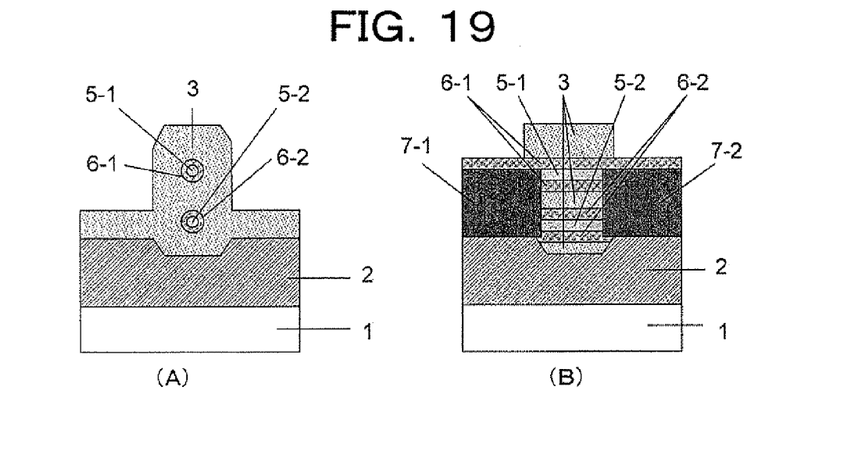
FIG. 19 is a fabrication process diagram of the nano-wire field effect transistor in accordance with the first embodiment of the present invention.

Next, a gate electrode material 30 is deposited, as shown in FIG. 17. As the gate electrode material, a poly-silicon or a refractory metal, for example, TiN, Mo, Ta/Mo alloy and the like are used. In the following step, a gate pattern 24 is formed by electron beam lithography, as shown in FIG. 18. Next, as shown in FIG. 19, a gate electrode 3 is formed by etching the gate electrode material 30 by RIE. In the next step, a CVD oxide film is deposited, contact hole is opened, and an aluminum electrode is then formed. These processes are omitted here since they are similar to the fabrication process of the conventional integrated circuit. By these processes, the fabrication of the nano-wire field effect transistor having a vertical pair of nano-wires each having a circular cross-section shape in accordance with the present invention is completed.

Second Embodiment

Figure 20:
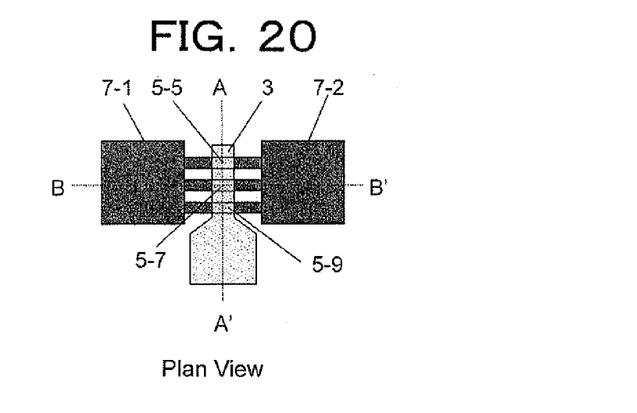
FIG. 20 is a plan view of a nano-wire field effect transistor in accordance with the second embodiment of the present invention.
Figure 21:
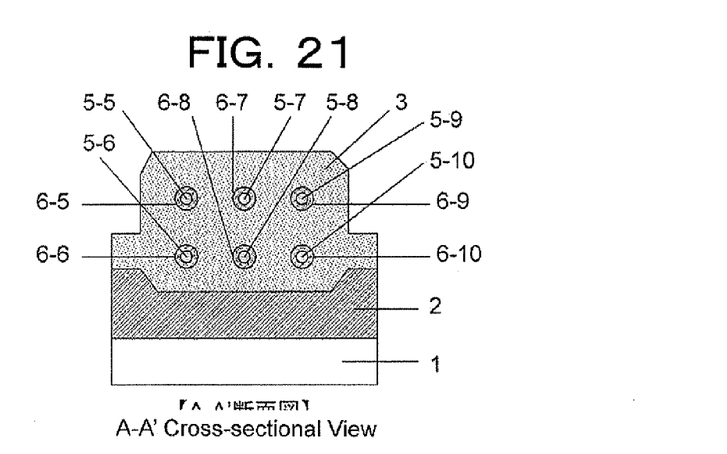
FIG. 21 is an A-A' cross-sectional view of FIG. 20.
Figure 22:
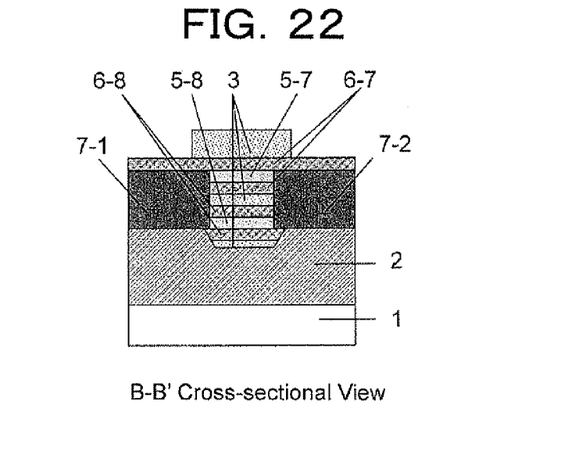
FIG. 22 is a B-B' cross-sectional view of FIG. 20.

FIGS. 20, 21 and 22 show the second embodiment of the present invention. FIG. 20 shows a plan view of a nano-wire field effect transistor in accordance with the present invention. In this figure, a plurality of pairs of nano-wires each having a circular cross-section shape arranged one above the other are arranged in parallel. FIG. 21 shows an A-A' cross-sectional view thereof, and FIG. 22 shows a B-B' cross-sectional view thereof. In FIGS. 20 to 22, numeral reference 1 denotes a substrate, 2 denotes a buried oxide film, 3 denotes a gate electrode, 5-5, 5-6, 5-7, 5-8, 5-9, and 5-10 denote nano-wires each having a circular cross-section shape, 6-5, 6-6, 6-7, 6-8, 6-9, and 6-10 denote gate insulator films, and 7-1 and 7-2 denote source-drain regions.

A fabrication process of the second embodiment is basically same as that of the first embodiment. A different point is that in the electron beam lithography process in the above paragraph 0016, a pattern of the nano-wire is formed so that a plurality of pairs of nano-wires each having a circular cross-section shape can be arranged. Other processes are the same as those of the first embodiment.

Third Embodiment

Figure 23:
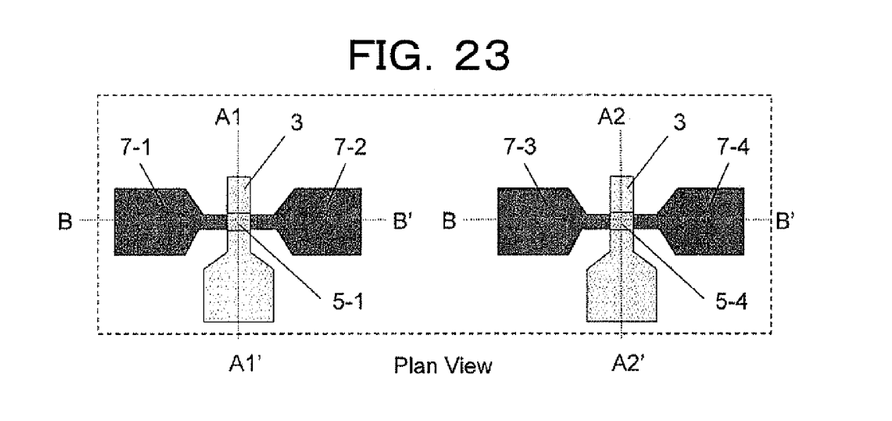
FIG. 23 is a plan view of an integrated circuit including the nano-wire field effect transistor in accordance with the third embodiment of the present invention.
Figure 24:
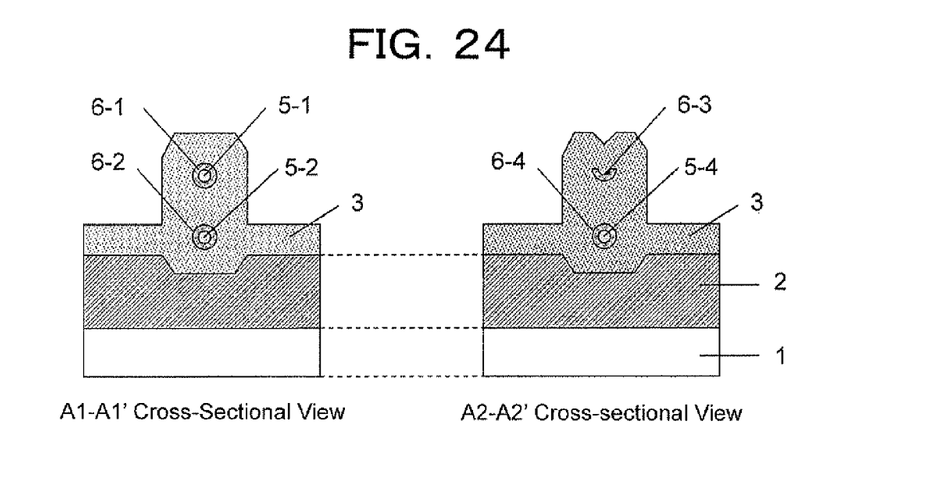
FIG. 24 is A1-A1' and A2-A2' cross-sectional views of FIG. 23.
Figure 25:
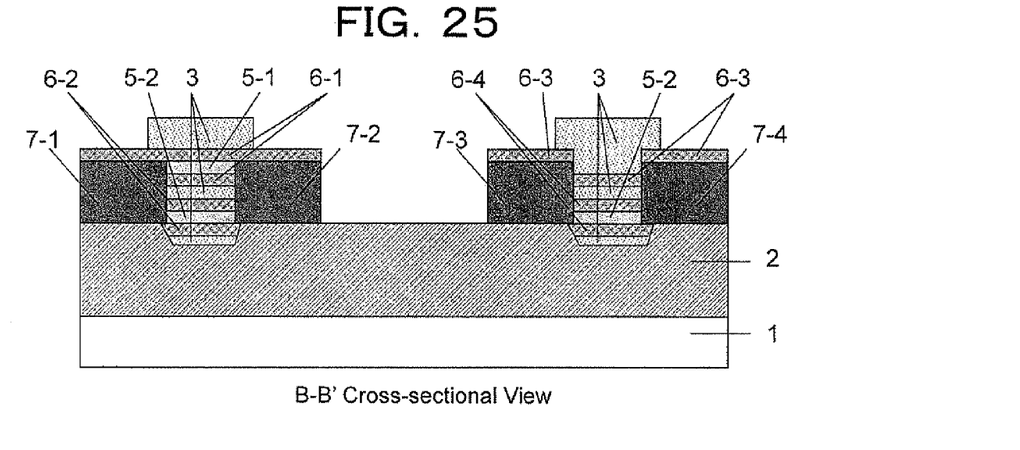
FIG. 25 is a B-B' cross-sectional view of FIG. 23.

FIGS. 23, 24, and 25 show the third embodiment of the present invention. FIG. 23 shows a plan view of an integrated circuit in accordance with the present invention. In this figure, a nano-wire field effect transistor including a pair of nano-wires each having a circular cross-section shape arranged one above the other is used as a PMOS, whereas a nano-wire field effect transistor with a nano-wire having a circular cross-section shape where the upper nano-wire a circular cross-section shape is removed by an etching is used as an NMOS. FIG. 24 shows an A1-A1' and A2-A2' cross-sectional views thereof, and FIG. 25 shows a B-B' cross-sectional view thereof.

In FIGS. 23 to 25, numeral reference 1 denotes a substrate, 2 denotes a buried oxide film, 3 denotes a gate electrode, 5-1, 5-2, and 5-4 are nano-wires each having a circular cross-section shape, 6-1, 6-2, 6-3, and 6-4 denote gate insulator films, and 7-1, 7-2, 7-3, and 7-4 denote source-drain regions.

A fabrication process of the third embodiment is basically same as that of the first embodiment, but following two points.

(1) In the ion implantation process in the above paragraph 0017, B or $BF_2+$ is implanted in the source-drain regions 7-1 and 7-2 of the nano-wire field effect transistor having a pair of nano-wires each having a circular cross-section shape arranged one above the other, whereas P or As is implanted in the source-drain regions 7-3 and 7-4 of the nano-wire field effect transistor which lacks an upper nano-wire a circular cross-section shape.

(2) After the formation of the gate electrode in the above paragraph 0021, the region of the nano-wire field effect transistor having a pair of nano-wires each having a circular cross-section shape arranged one above the other is protected by a thick resist film, and then another resist with low viscosity is coated with high speed. An etching back of the resist is performed by using an oxygen plasma, until a protruding head of intersecting part between the nano-wire and the gate electrode is opened. In the following step, the gate electrode, the oxide film and the upper nano-wire are successively etched by RIE with the etching gas species changed accordingly. Finally, the resist is removed by an aqueous solution including sulfuric acid and hydrogen peroxide, and a CVD oxide film is deposited as a protection film. Through these processes, fabrication of a nano-wire field effect transistor with a nano-wire having a shape with a circular cross-section in which an upper nano-wire is etched off and only a lower nano-wire remains is completed. Other processes are similar to those of the first embodiment.

Fourth Embodiment

Figure 26:
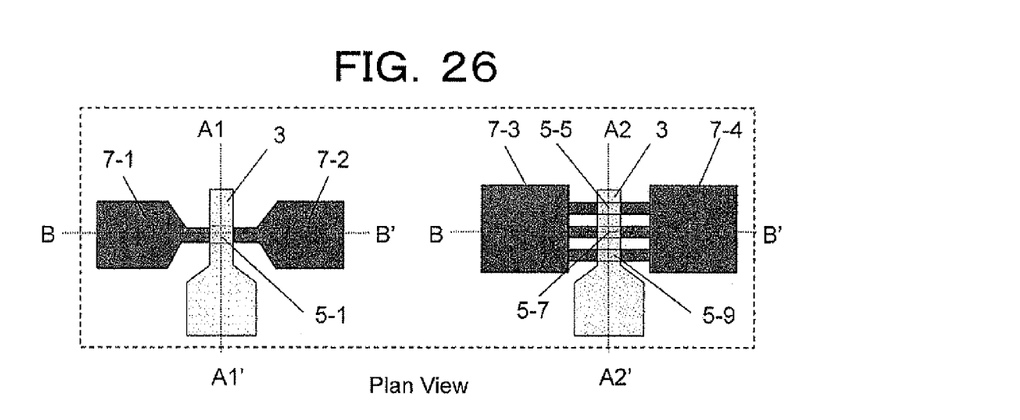
FIG. 26 is a plan view of an integrated circuit including the nano-wire field effect transistor in accordance with the fourth embodiment of the present invention.
Figure 27:
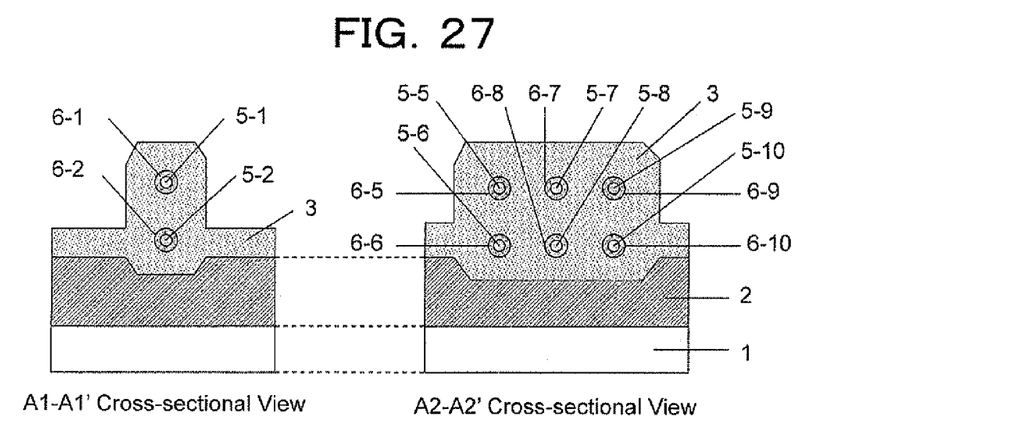
FIG. 27 is A1-A1' and A2-A2' cross-sectional views of FIG. 26.
Figure 28:
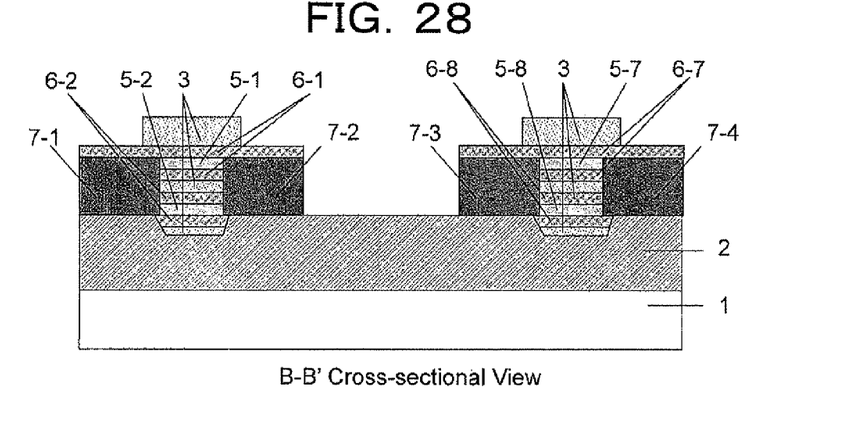
FIG. 28 is a B-B' cross-sectional view of FIG. 26.

FIGS. 26, 27 and 28 show the fourth embodiment of the present invention. FIG. 26 shows a plan view of an integrated circuit in accordance with the present invention, where a nano-wire field effect transistor having a pair of nano-wires each having a circular cross-section shape arranged one above the other and a nano-wire field effect transistor a plurality of pairs of nano-wires each having a circular cross-section shape being arranged one above the other are mixed. FIG. 27 shows A1-A1' and A2-A2' cross-sectional views thereof, and FIG. 28 shows a B-B' cross-sectional views thereof.

In FIGS. 26 to 28, numeral reference 1 denotes a substrate, 2 denotes a buried oxide film, 3 denotes a gate electrode, 5-1, 5-2, 5-5, 5-6, 5-7, 5-8, 5-9, and 5-10 denote nano-wires each having a circular cross-section shape, 6-1, 6-2, 6-5, 6-6, 6-7, 6-8, 6-9, and 6-10 denote gate insulator films, and 7-1, 7-2, 7-3, and 7-4 denote source-drain regions.

A fabrication process of the fourth embodiment is basically same as that of the first embodiment. A different point is that two kinds of resist patterns are simultaneously drawn for two types of nano-wire field effect transistors in the electron beam lithography in the above paragraph 0016. Other processes are similar to those of the first embodiment.

In the above first to fourth embodiments, a nano-wire field effect transistor including two nano-wires and an integrated circuit including the transistor are demonstrated. However, a nano-wire field effect transistor including an even number more than four of nano-wires arranged one above the other and an integrated circuit including such a transistor can be fabricated by using an SOI substrate having more than two SOI layers and buried oxide films on the surface. In this example, a current drivability will be improved.

EXPLANATION TO SYMBOLS

1: substrate
2: buried oxide film 3, 3-1, 3-2: gate electrode
4: insulating film
5, 5-1, 5-2, 5-4, 5-5, 5-6, 5-7, 5-8, 5-9, 5-10: nano-wire having a circular cross-section shape
6-1, 6-2, 6-4, 6-5, 6-6, 6-7, 6-8, 6-9, 6-10: gate insulator film
7-1, 7-2, 7-3, 7-4: source-drain region
9: (100) silicon crystal layer
10: oxide film
11: oxide film
11-1: hard mask
13-1, 13-2: insulating film
20, 21: resist pattern
22, 23: gap
24: resist pattern
30: gate electrode material
40-1, 40-2: nano-wire having a triangular cross-section shape
50: fin channel having a rectangular cross-section shape
50-1, 50-2, 50-3: nano-wire having a circular cross-section shape
60-1, 60-2, 60-3: gate insulator film

The invention claimed is:

1. A manufacturing method of the nano-wire field effect transistor, comprising steps of:
preparing an SOI substrate having a (100) surface orientation;
processing a silicon crystal layer comprising the SOI substrate into a standing plate-shaped member having a rectangular cross-section;
processing the silicon crystal layer by orientation dependent wet etching and thermal oxidation into a shape where two triangular columnar members are arranged one above the other with a spacing from each other so as to face along the ridge lines of the triangular columnar members; and
processing the two triangular columnar members into a circular columnar member configuring a nano-wire by hydrogen annealing or thermal oxidation.

2. A manufacturing method of the nano-wire field effect transistor, comprising steps of:
preparing an SOI substrate having a (100) surface orientation and including two or more SOI layers and buried oxide films;
processing a silicon crystal layer configuring the SOI layer into a standing plate-shaped member having a rectangular cross-section;
processing the silicon crystal layer by orientation dependent wet etching and thermal oxidation into a shape where two triangular columnar members are arranged one above the other with a spacing from each other so as to face along the ridge lines of the triangular columnar members; and
processing the two triangular columnar members into a circular columnar member comprising a nano-wire by hydrogen annealing or thermal oxidation.

* * * * *